United States Patent [19]

Sharp

[11] Patent Number: 4,823,314
[45] Date of Patent: Apr. 18, 1989

[54] INTEGRATED CIRCUIT DUAL PORT STATIC MEMORY CELL

[75] Inventor: Owen Sharp, Aptos, Calif.

[73] Assignee: Intel Corporation, Santa Clara, Calif.

[21] Appl. No.: 132,416

[22] Filed: Dec. 14, 1987

Related U.S. Application Data

[63] Continuation of Ser. No. 808,464, Dec. 13, 1985, abandoned.

[51] Int. Cl.$^4$ .................. G11C 5/02; G11C 11/40; H01L 27/02
[52] U.S. Cl. .................. 365/51; 365/156; 365/190; 365/230; 365/181; 357/42
[58] Field of Search ............... 365/154, 156, 174, 189, 365/190, 230, 51, 63, 72, 181; 357/45, 42

[56] References Cited

U.S. PATENT DOCUMENTS

| | | | |
|---|---|---|---|
| 4,435,787 | 3/1984 | Yasuoka | 365/190 |
| 4,481,524 | 11/1984 | Tsujide | 365/156 |
| 4,524,377 | 6/1985 | Eguchi | 357/42 |
| 4,541,076 | 9/1985 | Bowers et al. | 365/156 |
| 4,581,623 | 4/1986 | Wang | 357/42 |
| 4,623,989 | 11/1986 | Blake | 365/156 |

FOREIGN PATENT DOCUMENTS 0120485 10/1984 European Pat. Off. ............ 365/154

Primary Examiner—Stuart N. Hecker
Assistant Examiner—Glenn A. Gossage
Attorney, Agent, or Firm—Blakely, Sokoloff, Taylor & Zafman

[57] ABSTRACT

A CMOS dual port RAM cell is disclosed wherein one of the word lines is parallel to one of the bit lines in the cell. One bit line is accessed through a p-channel transistor while the other bit lines are accessed through n-channel transistors. This configuration permits the cell to use a single well, thus permitting higher density.

14 Claims, 4 Drawing Sheets

INTEGRATED CIRCUIT DUAL PORT STATIC MEMORY CELL

This is a continuation of application Ser. No. 808,464, filed Dec. 13, 1985, now abandoned.

BACKGROUND OF THE INVENTION

1. Field of the Invention

The invention relates to the field of dual port static memory cells.

2. Prior Art

In data handling there is sometimes a need for a random-access memory with dual ports. In these memories, for instance, n words of m bits can be read into or from the memory in parallel through a first port or ports. Also, m words of n bits can be read from or read into the memory in parallel at a second port or ports. The use of such a dual port memory is described in conjunction with FIG. 1.

Dual port memory cells using bistable circuits are known in the prior art. The general layout of these cells is described in conjunction with FIG. 2a. This is the closest prior art known to the Applicant. As will be seen with the present invention, there is a general departure from this prior art layout which permits the fabrication of a denser cell.

SUMMARY OF THE INVENTION

An integrated circuit dual port static memory cell is disclosed. The cell includes a first word line disposed in a first direction for accessing data at a first port. A second word line is disposed in a second direction generally perpendicular to the first direction, to permit accessing of data at a second port. A first bit line generally parallel to the second word line provides data for the first port. A second bit line which is generally parallel to the first word line provides data at the second port. A bistable circuit coupled to the first and second word lines and first and second bit lines provides the storage for the cells.

As will be seen from the detailed description of the invention, when realized in a complementary metal-oxide-semiconductor (CMOS) circuit, the memory cell is formed in two continuous regions of opposite conductivity type.

DETAILED DESCRIPTION OF THE INVENTION

A dual port static memory cell is described. In the following description, numerous specific details are set forth such as specific conductivity types, etc., in order to provide a thorough understanding of the present invention. It will be obvious, however, to one skilled in the art that the present invention may be practiced without these specific details. In other instances, well-known structures and processing steps have not been described in detail in order not to necessarily obscure the invention.

DESCRIPTION OF SYSTEM IN WHICH THE PRESENT INVENTION IS USED

In the presently preferred embodiment, the dual port memory cell is fabricated with complementary metal-oxide-semiconductor (CMOS) technology. The integrated circuit which contains the dual port random-access memory is a discriminator, portions of which are described in conjunction with FIG. 1.

Figure 1:
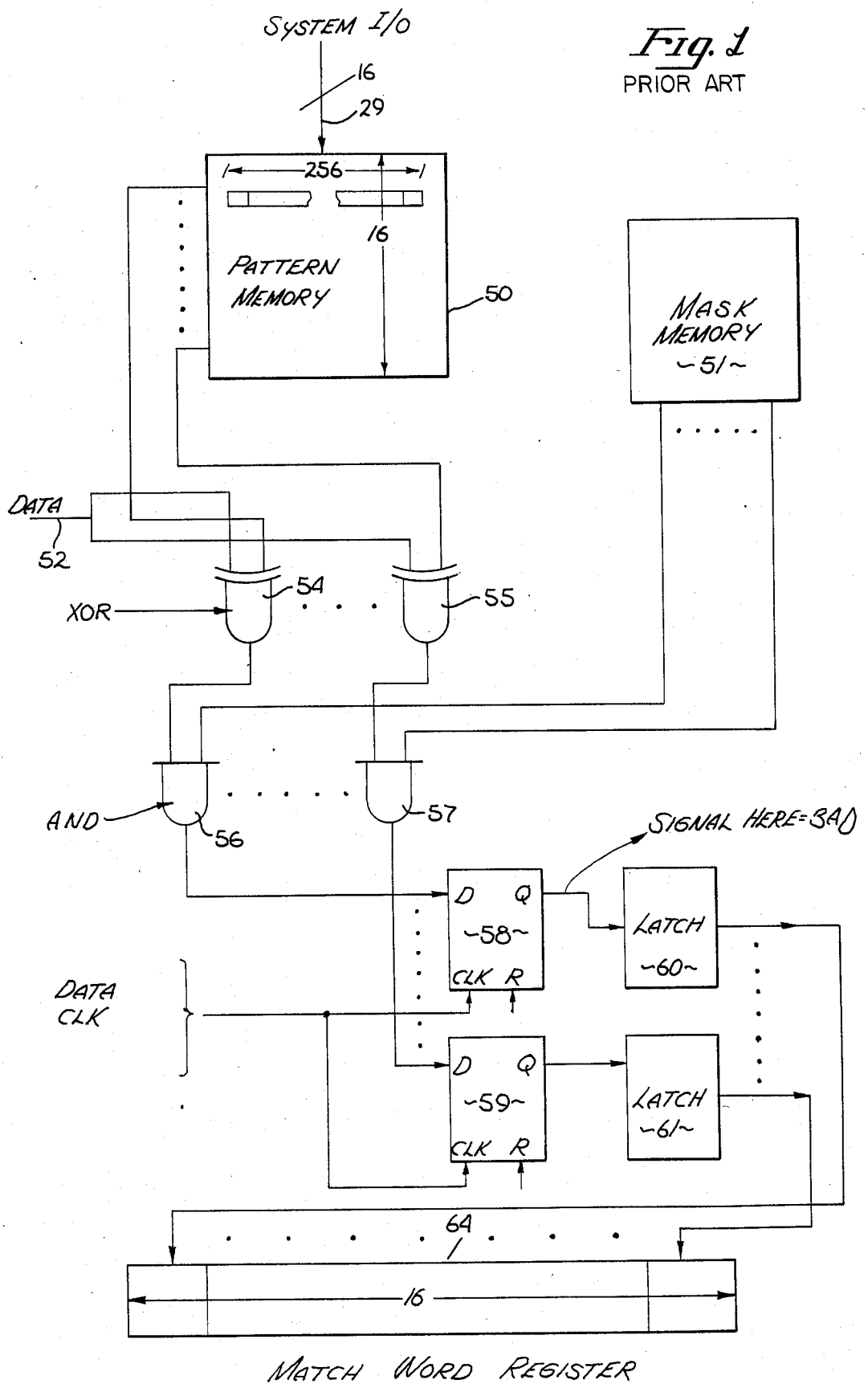
FIG. 1 is a block diagram illustrating the use of a dual port RAM.

Referring to FIG. 1, the portion of the discriminator which includes the dual port memory (pattern memory 50) is illustrated. The discriminator receives serial data and determines whether a particular receiver is entitled to receive each packet of data. The packets may be of any length. The transmission system includes a start and stop sequence to permit the identification of the beginning and end of a packet (HDLC protocol). The packets include codes which are matched against codes in the pattern memory 50. If a match occurs, then the packet of data is saved (i.e., the receiver is entitled to the packet). Otherwise, the data is written over and the receiver is thereby denied access to the packet. (The data is initially brought into a rolling buffer in the discriminator and data is simply written over existing data if no match occurs.)

The pattern memory 50 of each discriminator stores sixteen 256 bit patterns. These patterns are written into the memory 50 through lines 29 (first part). Sixteen bits of any of the patterns can be accessed, for instance, to update the stored patterns.

The apparatus shown in FIG. 1 is used to compare up to sixteen stored patterns of memory 50 with the beginning of each data packet which contains the access codes to determine if a match occurs. If it does, by way of example, it is an indication that a user has paid for a particular service and is thus entitled to receive that particular data packet. The stored patterns in memory 50 are used one bit from each pattern on each memory cycle through a second port for this matching.

As each packet is received, the data is applied one bit at a time to line 52 from the rolling buffer. At the same time, data is read from the pattern memory. One bit from each of the patterns are simultaneously read and these sixteen bits are applied to sixteen exclusive OR gates, two of which (gates 54 and 55) are shown in FIG. 1. Thus, when the first bit of data in the pocket is applied to one terminal of all the gates from line 52, the first bit of the sixteen patterns stored in memory 50 are read from the memory and one bit of each pattern is applied to one of the gates. Then when the second bit is applied to line 52, the second bit in each of the patterns is read from memory 50, etc.

The exclusive OR gates provide a low output if the data and the stored patterns match. The outputs of exclusive OR gates are applied to sixteen AND gates such as gates 56 and 57. Assume for a moment that the output of mask 51 provides a high input to the gates 56 and 57. These gates than act to pass the output of gates 54 and 55. The output of the gates 56 and 57 are applied to 8 bistable circuits, two of which are shown, specifically flip-flops 58 and 59. These flip-flops also receive a clocking signal (DATA CLK) and a reset signal to reset the flip-flops for each packet. As long as there is a match between the data and the pattern, only low signals are applied to the D terminal of the flip-flops. However, if a high signal is applied to any of the flip-flops, the flip-flop remains set with a high output until a reset signal is applied to the flip-flop. The output of the flip-flops are latched as indicated by latches 60 and 61 and the output of the latches are applied to a match word register 64. By examining this register, it can be determined if any of the sixteen stored patterns matched the beginning of the data stream.

The system of FIG. 1 has the capability of matching the first 256 bits of a packet with the stored patterns. In some instances, it may be desirable to have patterns which are shorter in length. The mask memory 51 stores a mask pattern for each of the patterns stored in memory 50. These mask patterns are accessed at the same time in the same manner as the pattern memory is accessed. The storage of a binary one in the mask pattern enables the gates 56 and 57. Thus, if a pattern in memory 50 is 150 bits in length, the corresponding mask pattern would consist of 150 binary ones and the remainder of the pattern binary zeroes. The binary zeroes make it appear as if a match occurs independent of the data stream. The binary zeroes force the outputs of gates 56 and 57 to be low.

The dual port RAM used from pattern memory 50 permits access to any single pattern stored in memory 50 without requiring access to other of the patterns. Lines 29 permit accessing of 16 bit fields of any of the stored patterns. This is used to update or change the stored patterns. Note that if a single port RAM is used for memory 50, that is, an ordinary RAM, the patterns would be changed by accessing the memory through the lines which are connected to the exclusive OR gates. When this occurs, one bit in each pattern is accessed and thus to change a single pattern may require accessing the entire memory.

PRIOR ART DUAL PORT MEMORY CELL

Figure 2A:
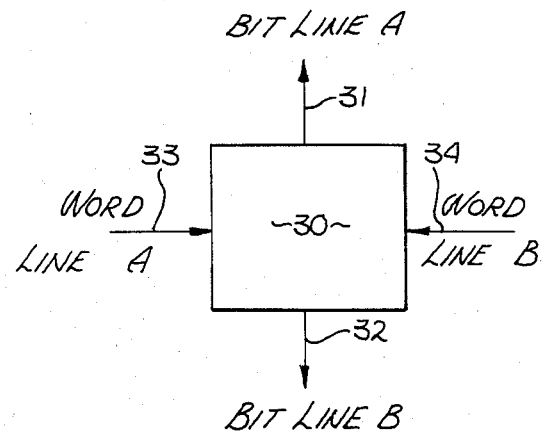
FIG. 2a illustrates the layout of a prior art dual port memory cell.

The overall layout of a prior art dual port RAM is shown in FIG. 2a. The prior art dual port RAM cell 30 typically included a bistable circuit (not shown). When CMOS fabrication is employed, both p and n channel devices are used in the bistable circuit. Bit line A (line 31) is parallel to bit line B (line 32). Similarly, word line A (line 33) and word line B (line 34) are parallel, and perpendicular to the bit lines. In some cases bit line A comprises a true line and complementary line, and bit line B a true line and complementary line. In one such prior art cell, bit line A and its complementary line are coupled to the bistable circuit through transistors of a first conductivity type and bit line B and its complementary line are coupled to the bistable circuit through transistors of the opposite conductivity type.

OVERALL LAYOUT OF THE DUAL PORT RAM CELL OF THE PRESENT INVENTION

Figure 2B:
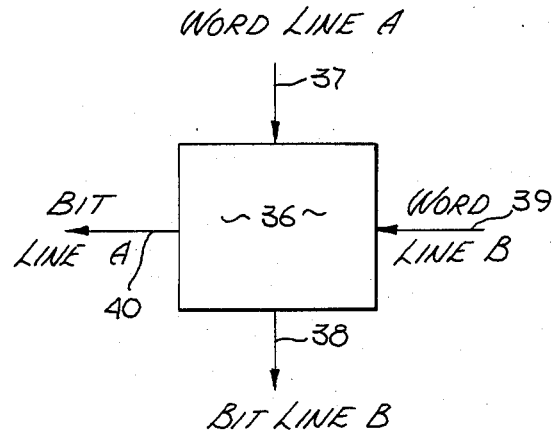
FIG. 2b illustrates the layout of a dual port memory cell fabricated in accordance with the present invention.

In FIG. 2b, the dual port RAM cell 36 of the present invention again includes a bistable circuit (not shown in this figure). Unlike the prior art cell, the word lines are perpendicular to one another, and the bit lines are perpendicular to one another. More specifically, word line A (line 37) is perpendicular to word line B (line 39). The word line A is parallel to bit line B (line 38). The bit lines A and B (lines 40 and 38, respectively) are perpendicular to one another.

As will be seen, this layout permits higher density cells to be fabricated when compared to the prior art cell of FIG. 2a.

ELECTRICAL SCHEMATIC OF THE DUAL PORT RAM CELL OF THE PRESENT INVENTION

Figure 3:
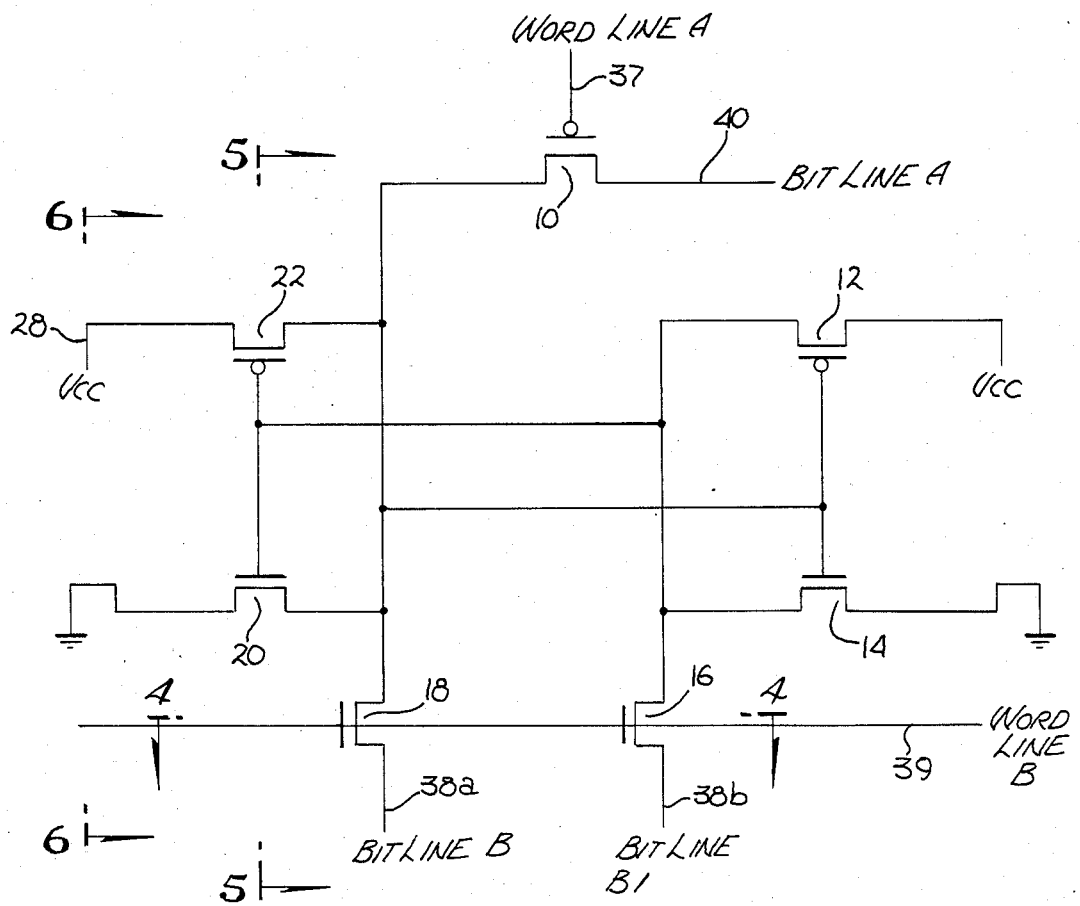
FIG. 3 is an electrical schematic showing the overall layout of a dual port memory cell built in accordance with the present invention.

In FIG. 3 the dual port RAM cell includes a bistable circuit having the p-channel transistors 12 and 22 which are cross-coupled with n-channel transistors 14 and 20. The p-channel transistors are coupled to $V_{CC}$ while the source terminals of the n-channel transistors are coupled to ground. The bit line A (line 40) is coupled to the bistable circuit through a p-channel transistor 10. The gate of this transistor comprises word line 37. The bit line B in the presently preferred embodiment comprises complementary lines 38a and 38b. These lines are coupled to the bistable circuit through the n-channel transistors 18 and 16, respectively. The gates of these transistors comprise the word line B (line 39).

Another distinction between the prior art cell of FIG. 2a and the cell of FIG. 2b and 3 is that one of the bit lines is coupled to the bistable circuit through a p-channel transistor (line 40) while the other bit lines are coupled to the cell through n-channel transistors (transistors 16 and 18).

DETAILED LAYOUT OF THE DUAL PORT RAM CELL OF THE PRESENT INVENTION

Figure 7:
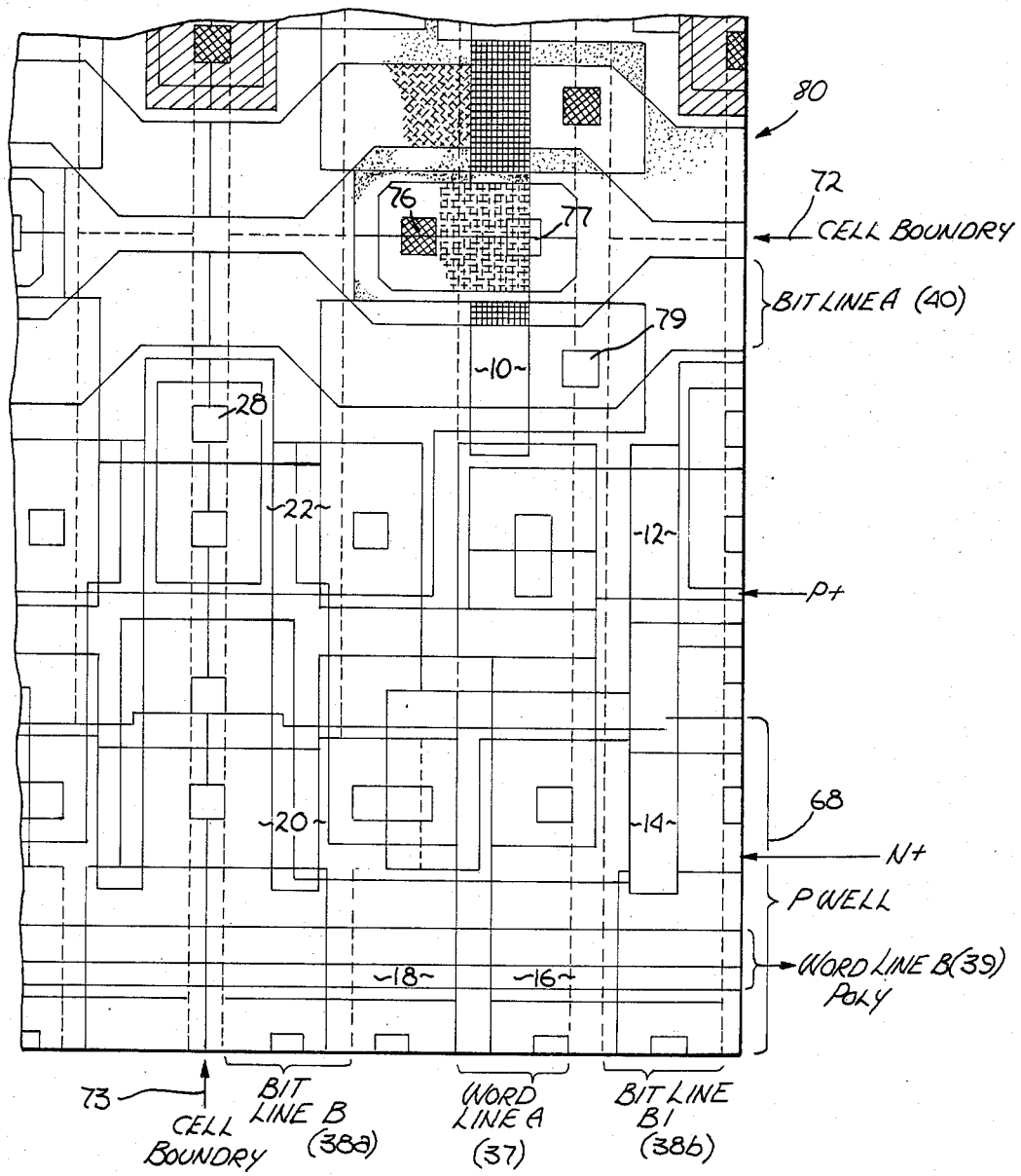
FIG. 7 is a detailed layout (plan view) of the presently preferred embodiment of a cell built in accordance with the present invention.

The transistors and lines of the cell of FIG. 3 have been drawn in positions which are close to their relative positions in the actual layout. The actual layout for the presently preferred embodiment is shown in FIG. 7; a single cell falls within the boundaries shown at arrows 72 and 73. The word line A and the metal bit lines B and B/ (38a and 38b, respectively) extend over the cell and as will be seen are fabricated from a second level of metal. The word line 37 is disposed between and parallel to the bit lines 38a and 38b. Line 37 is spaced-apart from both lines 38a and 38b. Word line 37 is coupled to the gate of transistor 10 through a via 77 which connects this metal line to a polysilicon gate member. The via 77 is on the cell boundary and shared with a neighboring cell 80. (This neighboring cell 80 is layed out in a mirror image to the cell under discussion.) The buried contact 76 couples one region of the transistor 10 with a polysilicon structure which provides the cross coupling within the bistable circuit. Contact 79 couples the other region of transistor 10 to the bit line A (line 40). This bit line is fabricated from a first level of metal. The polysilicon word line 39 is parallel to and spaced-apart from the line 40.

The four transistors forming the bistable circuit 12, 14, 20 and 22 are shown in FIG. 7. Also shown is a contact 28 which provides coupling to $V_{CC}$, again this contact is shared with a cell formed to the left of the cell under discussion.

The extent of the p-well which is formed in the n-type substrate is shown by bracket 68 in FIG. 7. The n-type transistors 14, 16, 18 and 20 are formed in this common and continuous well. The p-type transistors 10, 12 and 22 are formed in the substrate. Importantly, the use of a p-type transistor 10 to couple the cell to the bit line A eliminates the need for an additional well. That is, if an n-type transistor were used for this purpose (as done in the prior art) an additional well would be needed. The elimination of this additional well is one reason why the cell of the present invention can be laid out in higher density than the prior art cell of FIG. 2a.

(Actually, a single p-well is used for four cells. This is possible since the three cells which contact the lower right-hand corner of the cell under discussion are laid out in mirror image form. Thus, the transistors in these cells corresponding to transistors 14, 16, 18 and 20 are formed in the same p-well.)

CROSS SECTIONAL ELEVATION VIEWS OF THE DUAL PORT RAM CELL OF FIGS. 3 AND 7

Figure 4:
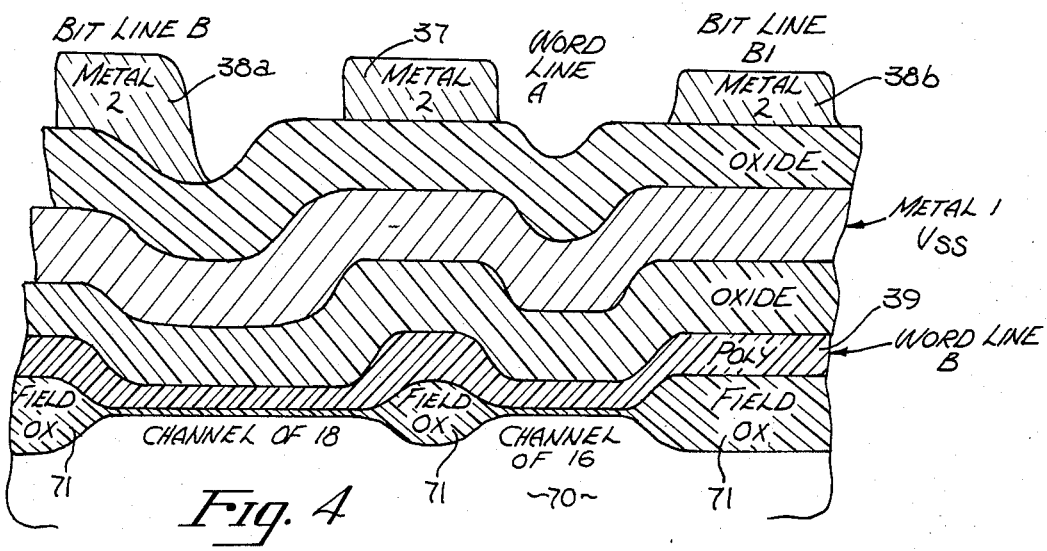
FIG. 4 is a cross-sectional elevation view of a substrate showing a memory cell built in accordance with the present invention, this cross-sectional view is generally taken through section lines 4—4 of FIG. 3.

The cross-sectional elevation view of FIG. 4 cuts through the channel regions of transistors 16 and 18 of the layout of FIG. 7. These channel regions fall between the field oxide regions 71. The polysilicon word line 39 is disposed directly above the channel regins and insulated from these regions. This line forms the gate member for transistors 16 and 18. An oxide layer separates the word line 39 from a metal line which is the ground line ($V_{SS}$). This line is formed from a first metal layer. An additional oxide layer separates the first metal layer from the second metal layer. The second metal layer is patterned to form the bit lines 38a and 38b and the metal word line 40.

Figure 5:
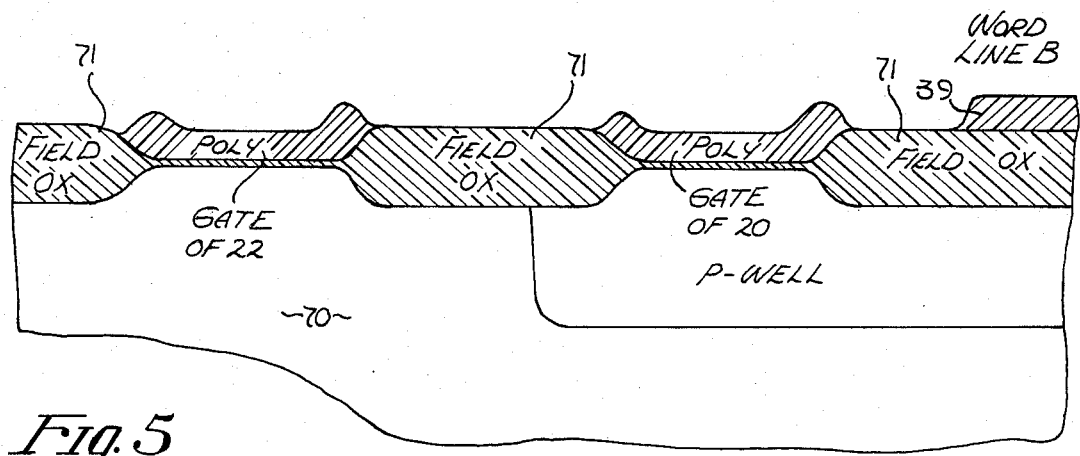
FIG. 5 is a cross-sectional elevation view of a substrate showing a memory cell built in accordance with the present invention, this cross-sectional view is generally taken through section lines 5—5 of FIG. 3.

In the cross-sectional view of FIG. 5 which is taken through transistors 20 and 22, again channel regions are shown separated by field oxide regions 71. The transistor 20 being an n-channel transistor is formed in a p-well disposed in the n-type silicon substrate 70. The transistor 22 is fabricated directly in the substrate 70. The polysilicon word line 39 can also be seen in this view. The polysilicon gates of transistors extend beyond the transistor to provide the cross coupling in the bistable circuit.

Figure 6:
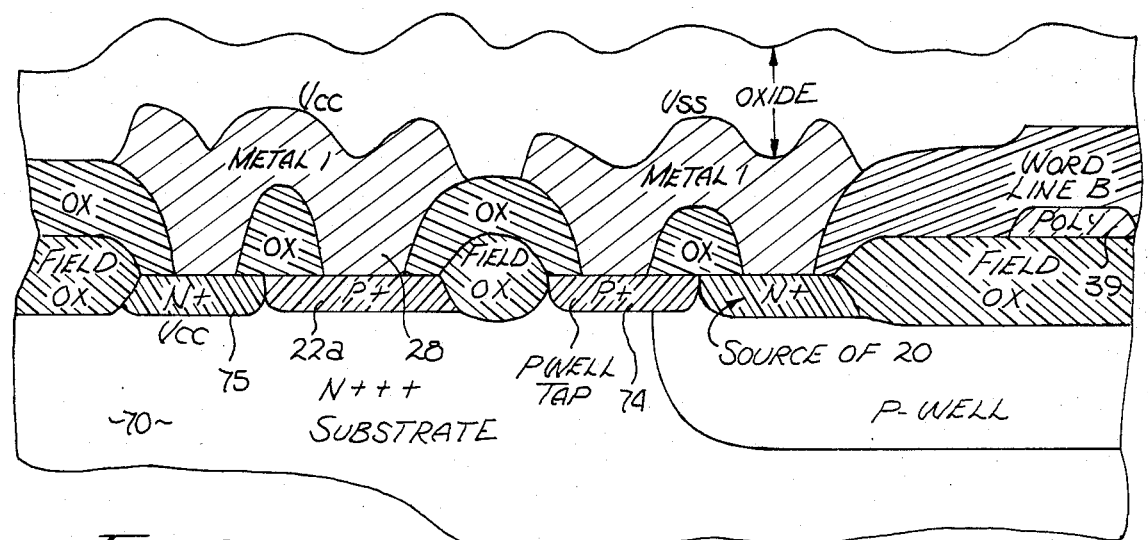
FIG. 6 is a cross-sectional elevation view of a substrate showing a memory cell built in accordance with the present invention, this cross-sectional view is generally taken through section lines 6—6 of FIG. 3.

In the cross-sectional view of FIG. 6 taken through section lines 6—6 of FIG. 3, two metal lines fabricated from the first layer of metal can be seen. One line carries the $V_{CC}$ potential and the other line is the ground ($V_{SS}$). For the particular view shown, the $V_{CC}$ line contacts one p-type region 22a of transistor 22 through the contact 28. (This contact is also shown in FIG. 7). The ground line contacts one region of transistor 20. The p+ region 74 is also in contact with the ground line to provide a tap to the p-well to maintain the well at $V_{SS}$. The region 75 in a similar manner is used to maintain the substrate 70 at $V_{CC}$. In the view of FIG. 6, the polysilicon word line 39 is again shown.

The above-described cell may be realized using well-known CMOS processing.

Thus, a dual port RAM cell has been described which in the preferred embodiment is fabricated with CMOS technology. Because of the layout of the cell, less area is required than with prior art cells.

I claim:

1. A plurality of integrated circuit dual port static memory cells, comprising:

a substrate of a first conductivity type;
a first continuous region of a second conductivity type formed on said substrate;
said plurality of cells formed in said substrate, said plurality of cells comprising a fist memory cell and a second memory cell, said second memory cell formed as a mirror image of said second memory cell;
said first memory cell comprising:
(a) a first word line disposed in a first direction for accessing said cell at a first port;
(b) a second word line disposed in a second direction, generally perpendicular to said first direction, for accessing said cell at a second port;
(c) a first bit line generally parallel to said second word line for providing data for said first port;
(d) at least one second bit line generally parallel to said first word line for providing data for said second port;
(e) a bistable circuit;
(f) a first transistor of a first conductivity type formed in said first continuous region coupled with said first word line and said bistable circuit;
(g) a second transistor of a second conductivity type formed in said substrate coupled with said second word line and said bistable circuit;
(h) a third and fourth transistor of a first conductivity type and a fifth and sixth transistor of a second conductivity type, said first, third and fourth transistors being formed in a common well;
whereby a plurality of dual port memory cells are realized requiring formation of a single continuous region on said substrate.

2. The plurality of cells defined by claim 1 wherein said first word line is spaced apart from said second bit line and wherein said second word line is spaced apart from said first bit line.

3. The plurality of cells defined by claim 2 wherein each of said cells includes two of said second bit lines disposed on opposite sides and spaced apart from a corresponding first word line.

4. The plurality of cells defined by claim 3 wherein said second, fifth and sixth transistors are formed in a common well.

5. The plurality of cells defined by claim 4 wherein each of said first and second bit lines is a metal line and at least one of said first and second word lines is metal.

6. The plurality of cells defined by claim 5 wherein said second, fifth and sixth transistors are formed in a p-well.

7. The plurality of cells defined by claim 6 further comprising:
a third cell of said plurality of cells formed as a mirror image of said first cell of said plurality of cells, said fourth, fifth and sixth transistors of said third cell being formed in the same region as said fourth, fifth and sixth transistors of said first cell;
a fourth cell of said plurality of cells formed as a mirror image of said third cell of said plurality of cells, said fourth, fifth and sixth transistors of said fourth cell being formed in the same region as said fourth, fifth and sixth transistors of said third cell.

8. A plurality of integrated circuit dual port static memory cells formed in a substrate, each cell comprising:
a first continuous region in said substrate of a first conductivity type;

a second continuous region in said substrate of a second conductivity type;

first, second and third transistors of said second conductivity type formed in said first region;

fourth, fifth and sixth transistors of said first conductivity type formed in said second region;

said second, third, fifth and sixth transistors being coupled to form a bistable circuit;

a first word line for accessing said cell at a first port coupled to said bistable circuit through said first transistor;

a second word line for accessing said cell at a second port being coupled to said bistable circuit through said fourth transistor;

a first bit line coupled to said first transistor for providing data at said first port;

a second bit line coupled to said fourth transistor for providing data at said second port;

a second cell of said plurality of cells formed as a mirror image of a first cell of said plurality of cells, said fourth, fifth and sixth transistors of said second cell being formed in the same second region as said fourth, fifth and sixth transistors of said first cell;

whereby a plurality of dual port memory cells are realized which share a common well region.

9. The plurality of cells defined by claim 8 wherein said first word line and said second bit line in each of said cells are generally parallel.

10. The plurality of cells defined by claim 9 wherein said second word line and said first bit line in each of said cells are generally parallel.

11. The plurality of cells defined by claim 10 wherein said second bit line in each of said cells comprises a pair of generally parallel lines for carrying complementary signals.

12. The plurality of cells defined by claim 9 wherein said first and second bit lines and said first word line in each of said cells are metal lines.

13. The plurality of cells defined by claim 12 wherein said first conductivity type is n-type.

14. The plurality of cells defined by claim 13 further comprising:

a third cell of said plurality of cells formed as a mirror image of said first cell of said plurality of cells, said fourth, fifth and sixth transistors of said third cell being formed in the same region as said fourth, fifth and sixth transistors of said first cell;

a fourth cell of said plurality of cells formed as a mirror image of said third cell of said plurality of cells, said fourth, fifth and sixth transistors of said fourth cell being formed in the same region as said fourth, fifth and sixth transistors of said third cell.

* * * * *

UNITED STATES PATENT AND TRADEMARK OFFICE
CERTIFICATE OF CORRECTION

PATENT NO. : 4,823,314

DATED : 4/18/89

INVENTOR(S) : Sharp

It is certified that error in the above-identified patent and that said Letters Patent is hereby corrected as shown below:

| col. 02, line 14 | delete "inthe" | insert --in the-- |
| col. 02, line 64 | delete "pocket" | insert --packet-- |
| col. 03, line 08 | delete "than" | insert --then-- |
| col. 05, line 28 | delete "regins" | insert --regions-- |

Signed and Sealed this

Twelfth Day of February, 1991

Attest:

HARRY F. MANBECK, JR.

Attesting Officer

Commissioner of Patents and Trademarks